US010714924B2

(12) United States Patent
Matsumoto et al.

(10) Patent No.: US 10,714,924 B2
(45) Date of Patent: Jul. 14, 2020

(54) GROUND FAULT OVERVOLTAGE RELAY DEVICE

(71) Applicant: Mitsubishi Electric Corporation, Chiyoda-ku, Tokyo (JP)

(72) Inventors: Tomoyoshi Matsumoto, Tokyo (JP); Shigetoo Oda, Tokyo (JP); Satoshi Takemura, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 277 days.

(21) Appl. No.: 15/574,108

(22) PCT Filed: Jun. 11, 2015

(86) PCT No.: PCT/JP2015/066877
§ 371 (c)(1),
(2) Date: Nov. 14, 2017

(87) PCT Pub. No.: WO2016/199272
PCT Pub. Date: Dec. 15, 2016

(65) Prior Publication Data
US 2018/0351345 A1 Dec. 6, 2018

(51) Int. Cl.
*H02H 3/26* (2006.01)
*H02H 3/353* (2006.01)
(Continued)

(52) U.S. Cl.
CPC ............. *H02H 3/353* (2013.01); *G01R 31/50* (2020.01); *H02H 1/0007* (2013.01);
(Continued)

(58) Field of Classification Search
USPC ...................................... 361/42–50
See application file for complete search history.

(56) References Cited

U.S. PATENT DOCUMENTS

2007/0085549 A1* 4/2007 Fischer .................. G01R 29/16
324/521
2008/0267235 A1* 10/2008 Ando ...................... H01S 3/097
372/38.02
2010/0076638 A1* 3/2010 Kitanaka ................. H02P 27/06
701/22

FOREIGN PATENT DOCUMENTS

JP 02-046128 A 2/1990
JP 2 530 007 B2 9/1996

OTHER PUBLICATIONS

International Search Report (PCT/ISA/210) dated Aug. 25, 2015, by the Japanese Patent Office as the International Searching Authority for International Application No. PCT/JP2015/066877.
(Continued)

*Primary Examiner* — Danny Nguyen
(74) *Attorney, Agent, or Firm* — Buchanan Ingersoll & Rooney PC

(57) ABSTRACT

A ground fault overvoltage relay device is configured to: determine whether or not a first condition is satisfied, the first condition being that at least two of line voltages between respective two phases are less than or equal to a first threshold value; determine whether or not a second condition is satisfied, the second condition being that a ratio between a minimum value of the line voltages between the respective two phases and a minimum value of the respective phase voltages is less than or equal to a second threshold value; determine whether or not a third condition is satisfied, the third condition being that the zero-phase voltage is greater than a third threshold value; and lock a ground fault detection output when the first condition is satisfied, or when the second condition is satisfied and the third condition is not satisfied.

7 Claims, 21 Drawing Sheets

(51) Int. Cl.
     *H02H 7/26*       (2006.01)
     *G01R 31/50*     (2020.01)
     *H02H 1/00*       (2006.01)
     *H02H 3/16*       (2006.01)
     H02H 3/08       (2006.01)
     H02H 3/38       (2006.01)
     H02H 3/30       (2006.01)
(52) U.S. Cl.
     CPC .............. *H02H 3/165* (2013.01); *H02H 7/26* (2013.01); *H02H 3/083* (2013.01); *H02H 3/26* (2013.01); *H02H 3/302* (2013.01); *H02H 3/38* (2013.01)

(56) References Cited

OTHER PUBLICATIONS

Written Opinion (PCT/ISA/237) dated Aug. 25, 2015, by the Japanese Patent Office as the International Searching Authority for International Application No. PCT/JP2015/066877.
Notification of Reasons for Refusal for Japanese Application No. 2015-545538 dated Nov. 13, 2015.

\* cited by examiner

GROUND FAULT OVERVOLTAGE RELAY DEVICE

TECHNICAL FIELD

The present disclosure relates to a ground fault overvoltage relay device.

BACKGROUND ART

Conventionally, there are various protection relay devices for protecting a power system, and ground fault overvoltage relay devices are often adopted to detect a ground fault accident in a resistance grounding system (or an ungrounded system). A ground fault overvoltage relay device acquires respective phase voltages from a voltage transformer (VT) connected to the system, and detects an accident based on a zero-phase voltage derived from the respective phase voltages.

Generally, a fuse is connected to a secondary circuit of the voltage transformer, to protect the voltage transformer from an overcurrent caused by a short circuit failure in the secondary circuit or the like. When the fuse blows and the secondary circuit is disconnected, the ground fault overvoltage relay device cannot receive respective correct phase voltages. Accordingly, the ground fault overvoltage relay device may incorrectly determine that a ground fault accident has been detected, and thereby incorrectly output a break command to a breaker or the like. Thus, techniques for preventing incorrect determination due to a disconnection in the secondary circuit of the voltage transformer have been disclosed.

Japanese Patent Laying-Open No. H02-46128 (PTD 1) discloses a ground fault overvoltage relay configured to acquire phase voltages from a secondary circuit of a voltage transformer connected to a power system, and detect a ground fault based on the magnitude of a zero-phase voltage obtained by synthesizing the respective phase voltages. The ground fault overvoltage relay includes a first determination unit configured to detect that at least two phases of line voltages obtained from the respective phase voltages are less than or equal to a predetermined value, a second determination unit configured to detect that a ratio between a minimum value of the line voltages and a minimum value of the phase voltages is less than or equal to a predetermined value, and lock means configured to lock a ground fault detection output when the first or second determination unit has a detection output.

CITATION LIST

Patent Document

PTD 1: Japanese Patent Laying-Open No. H02-46128

SUMMARY OF INVENTION

Technical Problem

Generally, a secondary circuit or a tertiary circuit of a voltage transformer which inputs a voltage into a ground fault overvoltage relay device is provided with a limiting resistor for limiting a zero-phase current in the case of a ground fault accident and the like. However, the technique of PTD 1 does not consider a case where this limiting resistor is disconnected or not connected for a certain reason. Specifically, when the limiting resistor is disconnected or not connected, the ground fault overvoltage relay device according to PTD 1 may incorrectly detect that the secondary circuit of the voltage transformer described above is disconnected in the case of a one-phase ground fault accident, due to an unexpected relation among voltages.

The present disclosure has been made in view of the aforementioned problem, and an object thereof in an aspect is to provide a ground fault overvoltage relay device capable of achieving highly sensitive detection of a ground fault accident and preventing incorrect operation and incorrect non-operation due to an abnormality in a voltage transformer with more accuracy.

Solution to Problem

A ground fault overvoltage relay device according to an embodiment includes: an input unit configured to receive inputs of voltages of a power system detected by a voltage transformer; a ground fault detection unit configured to detect a ground fault based on a zero-phase voltage of the power system; a first determination unit configured to determine whether or not a first condition is satisfied, the first condition being that at least two of line voltages between respective two phases calculated based on respective phase voltages of the power system are less than or equal to a first threshold value; a second determination unit configured to determine whether or not a second condition is satisfied, the second condition being that a ratio between a minimum value of the line voltages between the respective two phases and a minimum value of the respective phase voltages is less than or equal to a second threshold value; a third determination unit configured to determine whether or not a third condition is satisfied, the third condition being that the zero-phase voltage is greater than a third threshold value; and a lock unit configured to lock a detection output by the ground fault detection unit when the first condition is satisfied, or when the second condition is satisfied and the third condition is not satisfied.

A ground fault overvoltage relay device according to another embodiment includes: an input unit configured to receive inputs of voltages of a power system detected by a voltage transformer; a ground fault detection unit configured to detect a ground fault based on a zero-phase voltage of the power system; a first determination unit configured to determine whether or not a first condition is satisfied, the first condition being that at least two of line voltages between respective two phases calculated based on respective phase voltages of the power system are less than or equal to a first threshold value; a second determination unit configured to determine whether or not a second condition is satisfied, the second condition being that a ratio between a minimum value of the line voltages between the respective two phases and a minimum value of the respective phase voltages is less than or equal to a second threshold value; a third determination unit configured to determine whether or not a third condition is satisfied, the third condition being that a maximum value of the respective phase voltages is greater than a third threshold value; and a lock unit configured to lock a detection output by the ground fault detection unit when the first condition is satisfied, or when the second condition is satisfied and the third condition is not satisfied.

Advantageous Effects of Invention

According to the present disclosure, highly sensitive detection of a ground fault accident can be achieved, and

DESCRIPTION OF EMBODIMENTS

Figure 1:
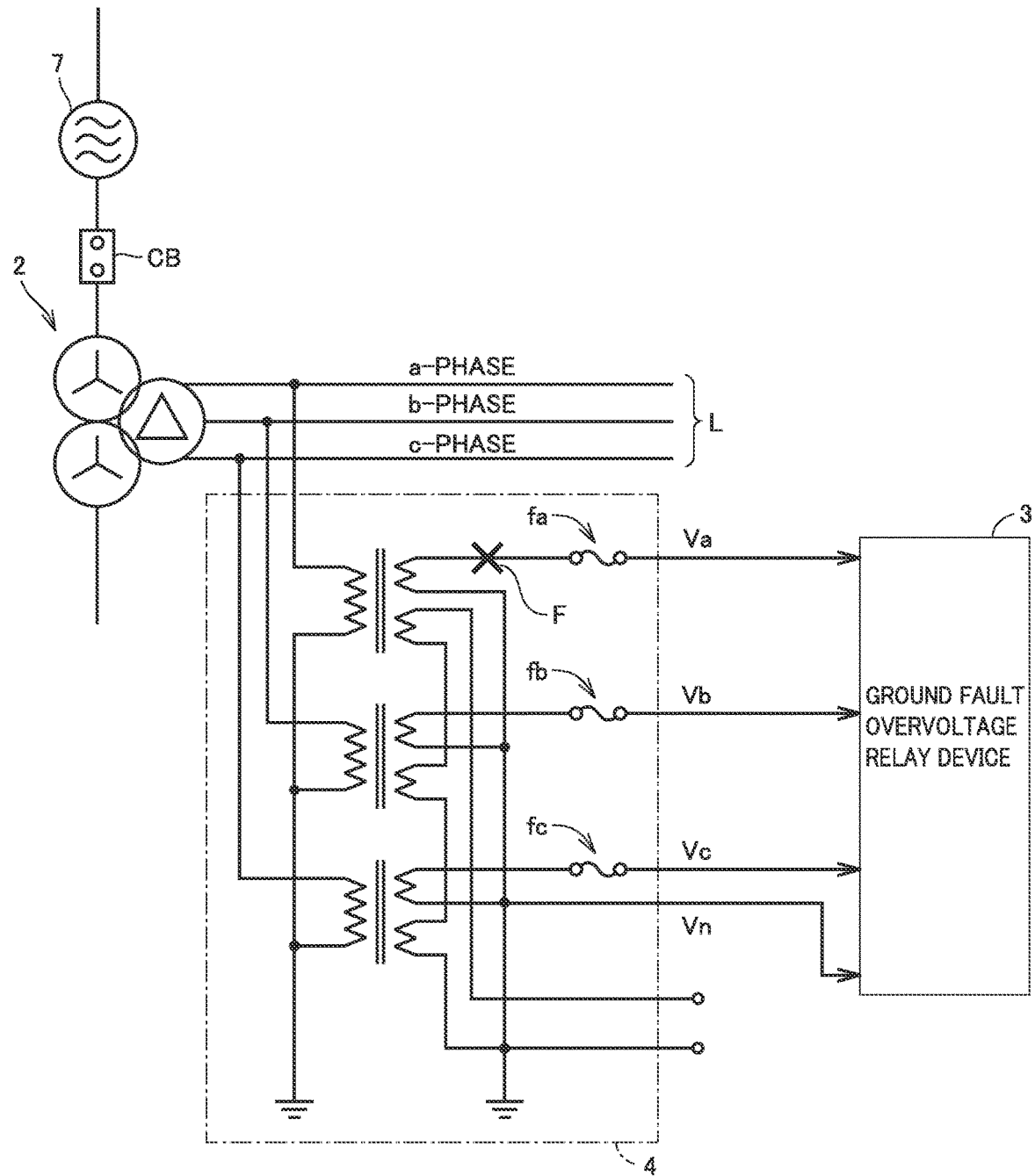
FIG. 1 is a view showing a power system to which a ground fault overvoltage relay device according to a first embodiment is applied.

Hereinafter, the present embodiment will be described with reference to the drawings. In the description below, identical parts will be designated by the same reference numerals. Since their names and functions are also the same, the detailed description thereof will not be repeated.

First Embodiment

<Overall Configuration>

FIG. 1 is a view showing a power system to which a ground fault overvoltage relay device according to a first embodiment is applied. Referring to FIG. 1, a transformer 2 is connected between a system power supply 7 and a load (not shown), which is a consumer such as a home, a building, or a factory, and transforms high-voltage power from system power supply 7 to low-voltage power that can be used by the consumer. The present embodiment will describe a case where transformer 2 has Y-connected primary winding and secondary winding and a Δ-connected tertiary winding.

A power transmission line L is a three-phase (a-phase, b-phase, c-phase) power system line, and receives power supply via the tertiary winding of transformer 2. In the present embodiment, it is assumed that the load such as a home, a building, or a factory is not connected to power transmission line L (that is, power transmission line L is a no-load system). It should be noted that, typically, the neutral point grounding method for power transmission line L is a high-resistance grounding system or an ungrounded system.

A voltage transformer 4 is connected to power transmission line L, to detect respective phase voltages of power transmission line L and output them to a ground fault overvoltage relay device 3. Specifically, phase voltages Va, Vb, and Vc of the a-phase, the b-phase, and the c-phase of power transmission line L are output from a secondary circuit side of voltage transformer 4 to ground fault overvoltage relay device 3. It should be noted that fuses fa, fb, and fc are connected to the secondary circuit of voltage transformer 4, for the respective phases.

Ground fault overvoltage relay device 3 performs an operation required to protect the power system, such as a relay operation, using an acquired system electrical quantity (voltage), and detects occurrence of a system accident. Specifically, ground fault overvoltage relay device 3 is a digital-type protection relay device for protecting power transmission line L. It should be noted that FIG. 1 shows an example in which ground fault overvoltage relay device 3 is connected to the secondary circuit of voltage transformer 4.

<Related Technique and Problem Thereof>

To begin with, a related technique, a problem in the related technique, and the like will now be described for understanding of the present embodiment. It should be noted that "the ground fault overvoltage relay device according to the related technique" corresponds to the ground fault overvoltage relay device according to Japanese Patent Laying-Open No. H02-46128 (PTD 1) described above.

In an impedance of a power system in a state where a load is not connected (no-load state), like power transmission line L described above, a capacitance between the power transmission line and the ground is dominant. The problem in the ground fault overvoltage relay device according to the related technique raised when a one-phase ground fault accident (here assumed as an a-phase ground fault accident) occurs in such a power transmission line will be described in detail.

Figure 2:
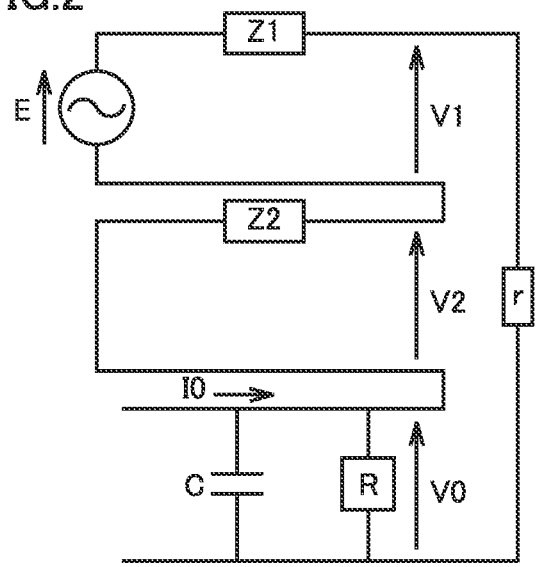
FIG. 2 is a view showing an equivalent circuit in the case of a one-phase ground fault accident, using the method of symmetrical coordinates.

An equivalent circuit obtained when an one-phase ground fault accident (a-phase ground fault accident) occurs in such a power transmission line can be expressed as shown in FIG. 2, using the method of symmetrical coordinates.

Figure 3:
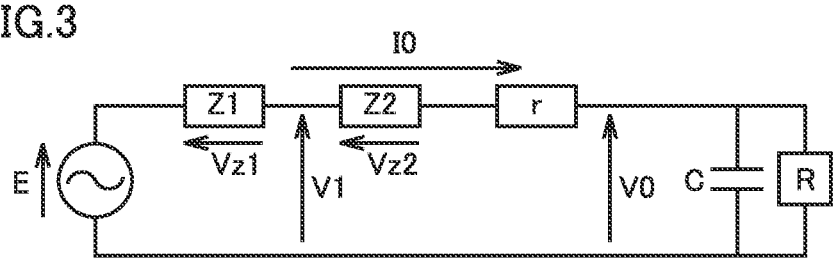
FIG. 3 shows a circuit obtained by rewriting the equivalent circuit shown in FIG. 2.

FIG. 2 is a view showing an equivalent circuit in the case of a one-phase ground fault accident, using the method of symmetrical coordinates. FIG. 3 shows a circuit obtained by rewriting the equivalent circuit shown in FIG. 2 for facilitating the description.

Referring to FIGS. 2 and 3, E represents a power supply voltage, Z1 represents a positive-phase impedance, Z2 represents a negative-phase impedance (line impedance), C represents the capacitance between the power transmission line and the ground, R represents a limiting resistor, and r represents a failure resistor. In addition, V1 represents a positive-phase voltage, V2 represents a negative-phase voltage, V0 represents a zero-phase voltage, and I0 represents a zero-phase current. Limiting resistor R is typically a resistor connected to the secondary circuit or a tertiary circuit of voltage transformer 4 for limiting the zero-phase current in the case of a ground fault accident and the like. Referring to FIG. 3, Vz1 represents a voltage across Z1, and Vz2 represents a voltage across Z2.

(In Case where Limiting Resistor is not Connected)

First, a case where limiting resistor R is not connected to the secondary circuit or the tertiary circuit of voltage transformer 4 will be considered. The relation between power supply voltage E and zero-phase voltage V0 in FIG. 3 in such a case can be expressed vectorially as shown in FIG. 4.

Figure 4:
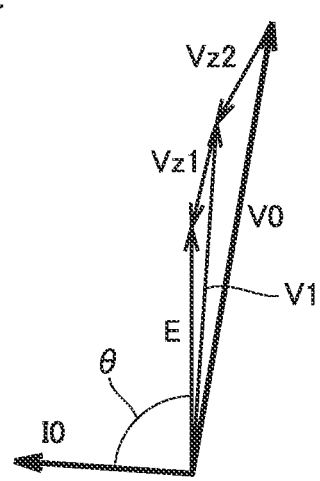
FIG. 4 is a vector diagram of symmetrical coordinate components in a case where a limiting resistor is not connected.

FIG. 4 is a vector diagram of symmetrical coordinate components in the case where the limiting resistor is not connected. The vector diagram as shown in FIG. 4 is obtained for the following reason. Specifically, since the power system in the no-load state is assumed, capacitance C is dominant in a load of a zero-phase circuit. Accordingly, zero-phase current I0 has a leading phase relative to power supply voltage E. In the example of FIG. 4, zero-phase current I0 has a leading phase of $\theta \approx 90°$. In addition, since positive-phase impedance Z1 and negative-phase impedance Z2 can substantially be regarded as inductors, voltage Vz1 across positive-phase impedance Z1 and voltage Vz2 across negative-phase impedance Z2 each have a leading phase (for example, approximately 90°) relative to zero-phase current I0.

Accordingly, vectors of voltages Vz1 and Vz2 each have a leading phase of approximately 180° relative to power supply voltage E. Then, by synthesizing power supply voltage E and voltages Vz1 and Vz2, zero-phase voltage V0 can be obtained. Therefore, as shown in FIG. 4, the relation of power supply voltage E<zero-phase voltage V0 is satisfied. This is the same principle as the Ferranti effect (a phenomenon in which a receiving end voltage becomes higher than a sending end voltage).

Figure 5:
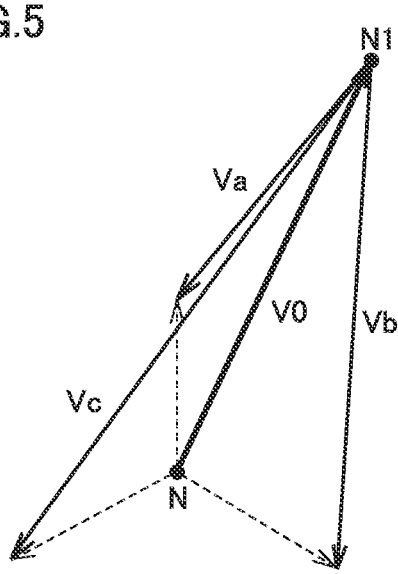
FIG. 5 is a vector diagram of phase voltages and a zero-phase voltage in the case where the limiting resistor is not connected.

In addition, since an end side of a vector of zero-phase voltage V0 indicates a potential of a neutral point, the relation between zero-phase voltage V0 and respective phase voltages Va, Vb, and Vc can be expressed as shown in FIG. 5.

FIG. 5 is a vector diagram of the phase voltages and the zero-phase voltage in the case where the limiting resistor is not connected. Referring to FIG. 5, it can be seen that respective phase voltages Va, Vb, and Vc become greater than the respective phase voltages in a sound state, due to a change in the potential of the neutral point (a change from a point N to a point N1) caused by a change in zero-phase voltage V0.

Here, the ground fault overvoltage relay device according to the related technique is configured to lock a ground fault output of the relay device when the relay device detects that the ratio between a minimum line voltage and a minimum phase voltage is less than or equal to a predetermined value β (for example, β=1.3), and the minimum phase voltage is more than or equal to a predetermined value (K2). Specifically, when the following equations (1) and (2) are satisfied, the ground fault overvoltage relay device according to the related technique locks the ground fault output.

$$\text{Min}(|Vab|,|Vbc|,|Vca|)/\text{Min}(|Va|,|Vb|,|Vc|) \leq \beta \quad (1)$$

$$\text{Min}(|Va|,|Vb|,|Vc|) \geq K2 \quad (2)$$

It should be noted that determination using equation (2) is performed to determine whether or not the respective phase voltages have abnormal values (i.e., to allow determination using equation (1) within a normal range). Here, it is regarded that equation (2) is satisfied.

In the example of FIG. 5, the minimum phase voltage is an a-phase voltage Va. As described above, a-phase voltage Va (that is, the denominator of the left-hand side of equation (1)) becomes greater than that when power transmission line L is in a normal state due to a change in the potential of the neutral point, and thus equation (1) is easily satisfied. That is, the ground fault overvoltage relay device according to the related technique may incorrectly determine that voltage transformer 4 has an abnormality, despite a one-phase ground fault accident, and lead to incorrect non-operation (i.e., lock the ground fault output).

In addition, in the case of a one-phase ground fault accident in a high-resistance grounding system or an ungrounded system, generally, line voltages Vab, Vbc, and Vca maintain a rated line voltage. However, when a power transmission line in cooperation with transformer 2 (for example, a power transmission line on a primary winding side of transformer 2 in FIG. 1) is closed again (i.e., when a breaker CB is switched from an open state to a closed state), an inrush current flows into transformer 2. Due to the inrush current, the balance among the respective phase voltages is disturbed, and the minimum line voltage (that is, the numerator of the left-hand side of equation (1)) becomes smaller. Accordingly, equation (1) is further easily satisfied, and the ground fault overvoltage relay device according to the related technique is more likely to lead to incorrect non-operation.

(In Case Where Limiting Resistor is Connected)

Next, a case where limiting resistor R is connected to the secondary circuit or the tertiary circuit of voltage transformer 4 will be considered. The relation between power supply voltage E and zero-phase voltage V0 in FIG. 3 in such a case can be expressed vectorially as shown in FIG. 6.

Figure 6:
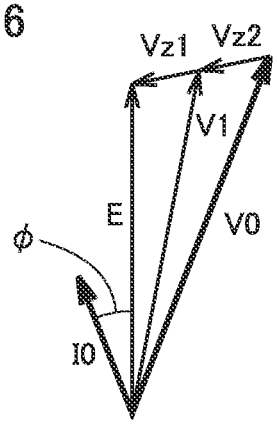
FIG. 6 is a vector diagram of symmetrical coordinate components in a case where the limiting resistor is connected.

FIG. 6 is a vector diagram of symmetrical coordinate components in the case where the limiting resistor is connected. The vector diagram as shown in FIG. 6 is obtained for the following reason. Specifically, even when the power system is in the no-load state, in the case where limiting resistor R is connected, a load of a zero-phase circuit is resistive (i.e., limiting resistor R is dominant). Accordingly, although zero-phase current I0 has a leading phase relative to power supply voltage E, the leading phase is smaller than that shown in FIG. 4. Specifically, a phase φ shown in FIG. 6 is smaller than phase θ shown in FIG. 4.

In addition, due to the phase relation between zero-phase current I0 and power supply voltage E, phases of voltages Vz1 and Vz2 relative to power supply voltage E are each a lagging phase, when compared with the phases of voltages Vz1 and Vz2 in FIG. 4. Therefore, the relation between power supply voltage E and zero-phase voltage V0 can be expressed as shown in FIG. 6. Referring to FIGS. 4 and 6, zero-phase voltage V0 in the case where limiting resistor R is connected (see FIG. 6) is smaller than zero-phase voltage V0 in the case where limiting resistor R is not connected (see FIG. 4). Thereby, the relation between zero-phase voltage V0 and respective phase voltages Va, Vb, and Vc can be expressed as shown in FIG. 7.

Figure 7:
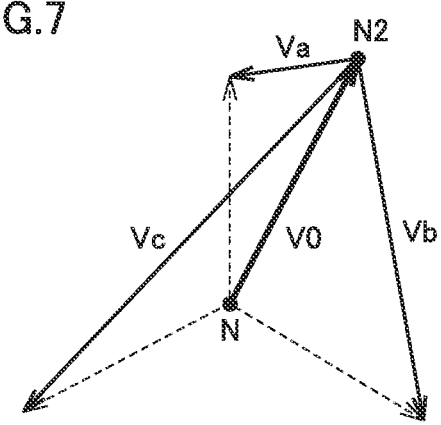
FIG. 7 is a vector diagram of the phase voltages and the zero-phase voltage in the case where the limiting resistor is connected.

FIG. 7 is a vector diagram of the phase voltages and the zero-phase voltage in the case where the limiting resistor is connected. Referring to FIG. 7, although the potential of the neutral point changes (a change from point N to a point N2) due to a change in zero-phase voltage V0, the change in the potential of the neutral point is smaller than that in the case where the limiting resistor is not connected (see FIG. 5).

In the example of FIG. 7, the minimum phase voltage is a-phase voltage Va, as in FIG. 5. However, a-phase voltage Va in FIG. 7 is smaller than a-phase voltage Va in FIG. 5. Accordingly, a-phase voltage Va (that is, the denominator of the left-hand side of equation (1)) becomes smaller than that when power transmission line L is in a normal state, and thus equation (1) is not satisfied. That is, in the case where limiting resistor R is connected, there is no possibility that the ground fault overvoltage relay device according to the related technique may incorrectly determine a one-phase ground fault accident as an abnormality in voltage transformer 4 and lead to incorrect non-operation (i.e., lock the ground fault output).

(In Case Where Inductive Reactance Load is Connected)

In FIGS. 2 to 7, the power system in the no-load state has been assumed. Operation of the ground fault overvoltage relay device according to the related technique in a case where an inductive reactance load is connected to the power system will now be considered just to make sure. It is assumed that limiting resistor R is not connected to the secondary circuit or the tertiary circuit of voltage transformer 4. The relation between power supply voltage E and zero-phase voltage V0 in such a case can be expressed vectorially as shown in FIG. 8.

Figure 8:
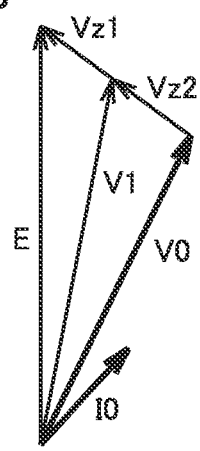
FIG. 8 is a vector diagram of symmetrical coordinate components in a case where an inductive reactance load is connected to the power system.

FIG. 8 is a vector diagram of symmetrical coordinate components in the case where the inductive reactance load is connected to the power system. The vector diagram as shown in FIG. 8 is obtained for the following reason. Specifically, in the power system in which the inductive reactance load is dominant, zero-phase current I0 has a lagging phase relative to power supply voltage E. In addition, since positive-phase impedance Z1 and negative-phase impedance Z2 can substantially be regarded as inductances as in the case of FIG. 4, voltages Vz1 and Vz2 each have a leading phase relative to zero-phase current I0. Therefore, the relation between power supply voltage E and zero-phase voltage V0 can be expressed as shown in FIG. 8.

Referring to FIGS. 4 and 8, zero-phase voltage V0 in the case where the inductive reactance load is connected to the power system (power transmission line) (see FIG. 8) is smaller than zero-phase voltage V0 in the case where limiting resistor R is not connected (see FIG. 4). Thereby, the relation between zero-phase voltage V0 and respective phase voltages Va, Vb, and Vc can be expressed as shown in FIG. 9.

Figure 9:
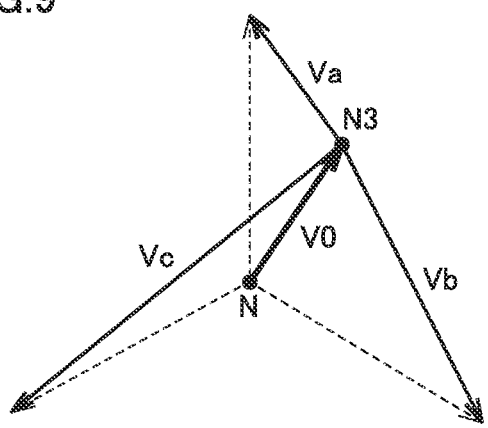
FIG. 9 is a vector diagram of the phase voltages and the zero-phase voltage in the case where the inductive reactance load is connected.

FIG. 9 is a vector diagram of the phase voltages and the zero-phase voltage in the case where the inductive reactance load is connected. Referring to FIG. 9, although the potential of the neutral point changes (a change from point N to a point N3) due to a change in zero-phase voltage V0, the change in the potential of the neutral point becomes smaller than that in the case where limiting resistor R is not connected (see FIG. 5). Accordingly, as in the case of FIG. 7, a-phase voltage Va (that is, the denominator of the left-hand side of equation (1)) is smaller than that when power transmission line L is in a normal state, and thus equation (1) is not satisfied. That is, in the case where the inductive reactance load is connected to the power system, even when limiting resistor R is not provided to voltage transformer 4, there is no possibility that the ground fault overvoltage relay device according to the related technique may incorrectly determine a one-phase ground fault accident as an abnormality in voltage transformer 4 and lead to incorrect non-operation.

(Summary)

As described above, the ground fault overvoltage relay device according to the related technique operates normally in the case where the limiting resistor is connected to the secondary circuit or the tertiary circuit of voltage transformer 4, or in the case where the load is connected to the power system. However, in the case where no load is connected to the power system and no limiting resistor is connected to the secondary circuit or the tertiary circuit of voltage transformer 4, the ground fault overvoltage relay device is highly likely to lead to incorrect operation.

Considering such a problem in the related technique, ground fault overvoltage relay device 3 according to the present embodiment appropriately detects a one-phase ground fault accident, by incorporating a configuration described later into the ground fault overvoltage relay device according to the related technique.

<Hardware Configuration>

Figure 10:
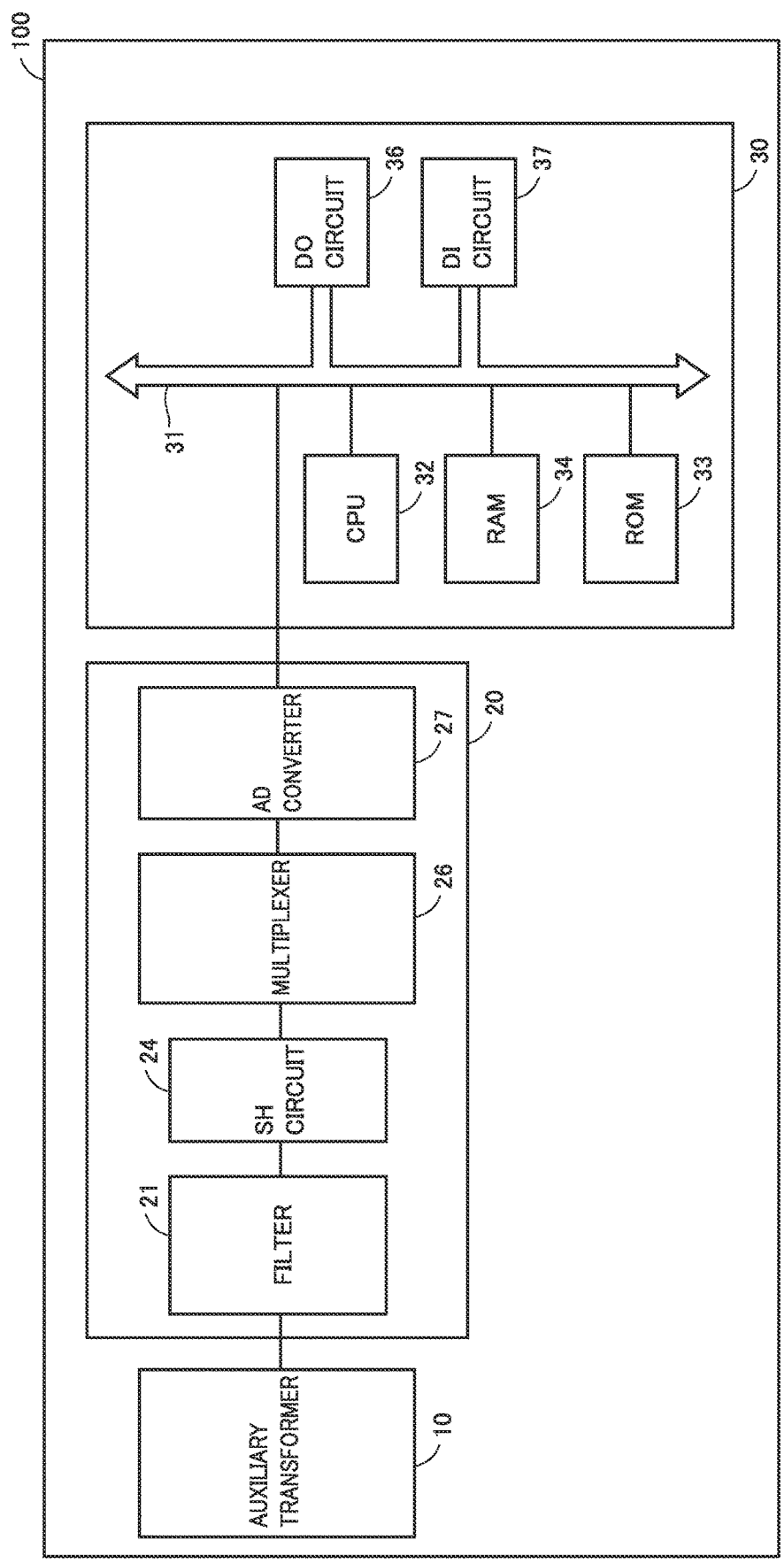
FIG. 10 is a view showing a hardware configuration of the ground fault overvoltage relay device according to the first embodiment.

FIG. 10 is a view showing a hardware configuration of ground fault overvoltage relay device 3 according to the first embodiment. Referring to FIG. 10, ground fault overvoltage relay device 3 includes an auxiliary transformer 10, an AD (Analog to Digital) conversion unit 20, and an operation processing unit 30.

Auxiliary transformer 10 acquires a system electrical quantity from voltage transformer 4, converts it into a smaller electrical quantity, and outputs it.

AD conversion unit 20 acquires the system electrical quantity (analog quantity) output from auxiliary transformer 10, and converts it into digital data. Specifically, AD conversion unit 20 includes a filter 21, a sample hold (SH) circuit 24, a multiplexer 26, and an AD converter 27.

Filter 21 is an analog filter, and removes a high-frequency noise component from a waveform signal of a voltage output from auxiliary transformer 10. An output of filter 21 is input into SH circuit 24.

SH circuit 24 samples the waveform signal of the voltage output from filter 21 at a predetermined sampling cycle. Based on a timing signal input from operation processing unit 30, multiplexer 26 sequentially switches the waveform signal input from SH circuit 24 in chronological order, and inputs it into AD converter 27.

AD converter 27 converts the waveform signal input from multiplexer 26, from analog data into digital data. AD converter 27 outputs the digitally converted waveform signal (digital data) to operation processing unit 30.

Operation processing unit 30 is mainly composed of a microcomputer. Specifically, operation processing unit 30 includes a CPU (Central Processing Unit) 32, a ROM (Read Only Memory) 33, a RAM 34 (Random Access Memory), a DO (digital output) circuit 36, and a DI (digital input) circuit 37. These are coupled by a bus 31.

As a control unit, CPU 32 controls operation of ground fault overvoltage relay device 3 by reading and executing a program stored beforehand in ROM 33. CPU 32 is a microprocessor, for example. It should be noted that the hardware may be an FPGA (Field Programmable Gate Array), an ASIC (Application Specific Integrated Circuit), and another circuit having an operation function, other than a CPU.

Specifically, CPU 32 acquires the digital data from AD conversion unit 20 via bus 31. CPU 32 performs a relay operation using the acquired digital data, according to the program stored in ROM 33. CPU 32 determines whether or not there is a failure in a protection section (i.e., a region to be protected) based on the result of the relay operation. When CPU 32 detects a failure (for example, when an operation value is more than a set value), CPU 32 outputs a break command to the breaker (not shown) connected to the power system via DO circuit 36, in order to separate the failed section from the power system (power transmission line L).

DI circuit 37 receives a digital input signal which is a signal indicating information as to whether the breaker is opened or closed, for example.

<Functional Configuration>

Figure 11:
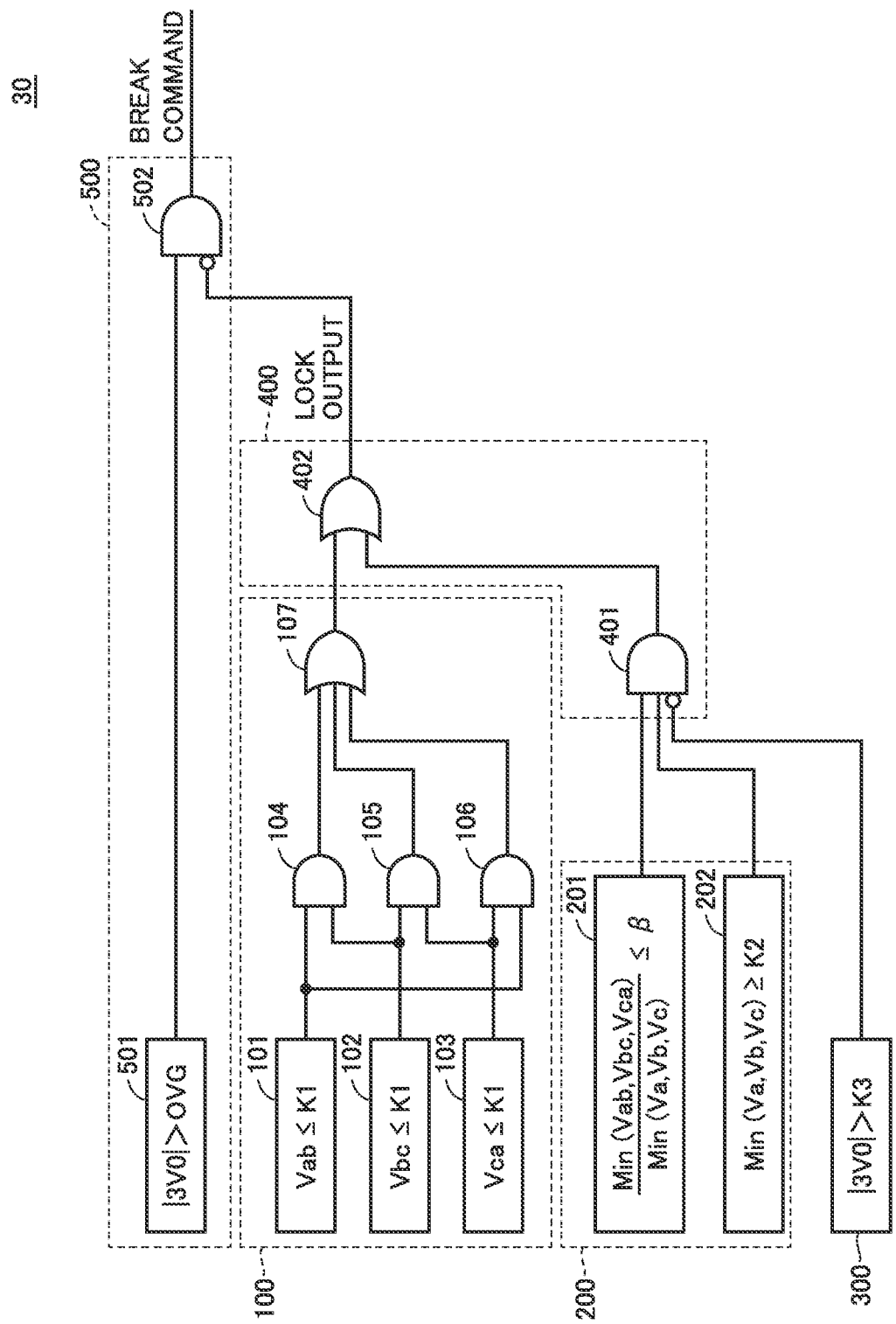
FIG. 11 is a block diagram showing a functional configuration of an operation processing unit according to the first embodiment.

FIG. 11 is a block diagram showing a functional configuration of operation processing unit 30 according to the first embodiment. Referring to FIG. 11, operation processing unit 30 includes a first determination unit 100, a second determination unit 200, a third determination unit 300, a lock unit 400, and a ground fault detection unit 500.

Ground fault detection unit 500 detects a ground fault accident based on the zero-phase voltage of power transmission line L. Specifically, ground fault detection unit 500 includes a determination circuit 501 and a logic gate 502. Determination circuit 501 is a so-called ground fault overvoltage relay element, and determines whether or not |3V0|>OVG is satisfied (for example, OVG has a setting range of more than or equal to 10 V, and is generally set to 30% to 40% of the zero-phase voltage obtained when one line has a complete ground fault). When determination circuit 501 determines that |3V0|>OVG is satisfied (i.e., when determination circuit 501 detects a ground fault accident in power transmission line L), determination circuit 501 outputs an output value "1" to logic gate 502. When determination circuit 501 determines that |3V0|>OVG is not satisfied (i.e., when determination circuit 501 does not detect a ground fault accident in power transmission line L), determination circuit 501 outputs an output value "0" to logic gate 502.

Logic gate 502 performs an AND operation on the output value of determination circuit 501 and a value obtained by inverting a logic level of an output of a logic gate 402 of lock unit 400. Specifically, when the output of determination circuit 501 is not blocked (i.e., not prevented) by the output of logic gate 402 (i.e., a lock command output described later), a break command is output to the breaker, as a detection output of ground fault detection unit 500. In contrast, when the output of determination circuit 501 is blocked by the output of logic gate 402, the break command is not output to the breaker.

First determination unit 100 and second determination unit 200 are provided to determine an abnormality in voltage transformer 4, and are also included in the ground fault overvoltage relay device according to the related technique.

First, the reason for providing first determination unit 100 and second determination unit 200 will now be described.

It is assumed that a disconnection occurs in the secondary circuit of voltage transformer 4 (for example, at a point F in FIG. 1). In this case, of respective phase voltages Va, Vb, and Vc serving as input voltages of ground fault overvoltage relay device 3, a-phase voltage Va, which is of a disconnected phase, is generated by induction from a secondary cable of phase voltage Vb or Vc, which is of a sound phase. Accordingly, it is generally considered that a region where Va (vector) exists is within the range of a region 700 shown in FIG. 12.

Figure 12:
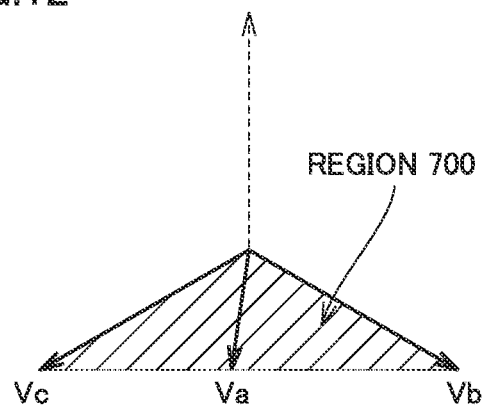
FIG. 12 is a view for illustrating a region where an a-phase voltage Va exists in a case where an a-phase is disconnected in a voltage transformer.

FIG. 12 is a view for illustrating the region where a-phase voltage Va exists in a case where the a-phase is disconnected in voltage transformer 4. Referring to FIG. 12, in the case where the a-phase is disconnected in voltage transformer 4, when there is no induced voltage from any one of the b-phase and the c-phase, which is another sound phase, a-phase voltage Va is 0 V due to the disconnection in the a-phase. However, when an induced voltage from the b-phase or the c-phase overlaps the a-phase, a-phase voltage Va is generated. Accordingly, the region where a-phase voltage Va, which is of the disconnected phase, exists is within the range of region 700 in FIG. 12.

Here, when voltage transformer 4 is normal, respective phase voltages Va, Vb, and Vc input into ground fault overvoltage relay device 3 can be expressed as shown in FIGS. 13 to 16, depending on the state of power transmission line L.

Figure 13:
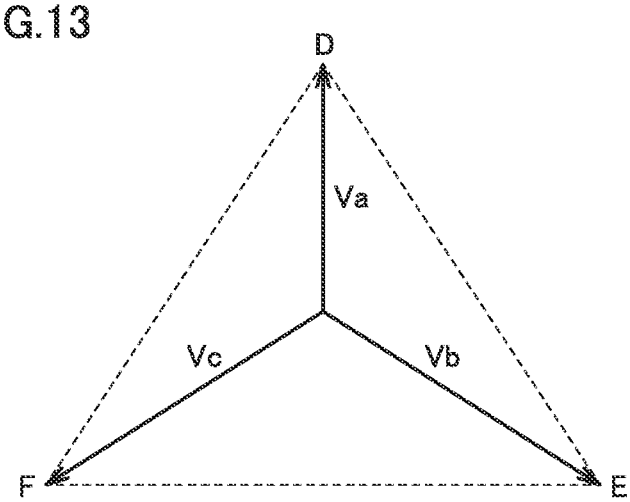
FIG. 13 is a vector diagram of the respective phase voltages in a case where a power transmission line is normal.
Figure 14:
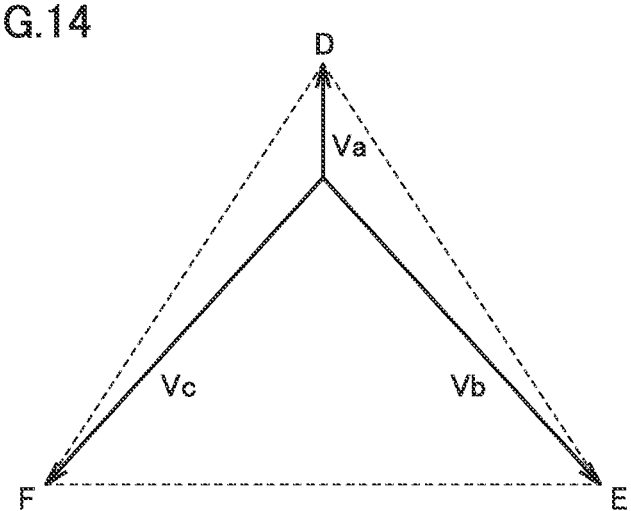
FIG. 14 is a vector diagram of the respective phase voltages in a case where a one-phase ground fault occurs in the a-phase of the power transmission line.
Figure 15:
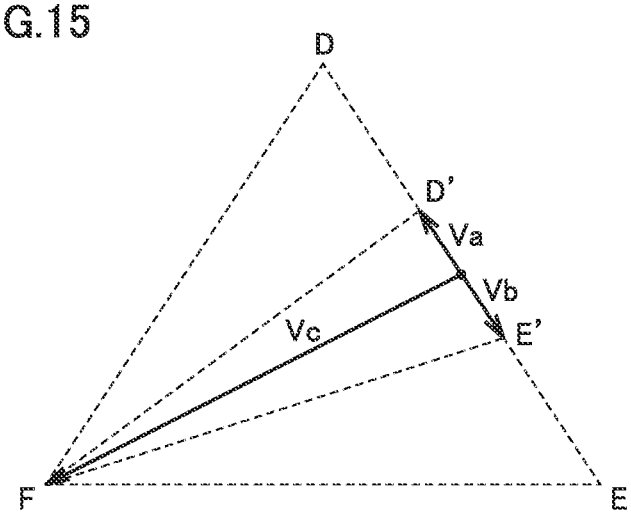
FIG. 15 is a vector diagram of the respective phase voltages in a case where a two-phase ground fault (without considering arc resistance) occurs in the a-phase and a b-phase of the power transmission line.
Figure 16:
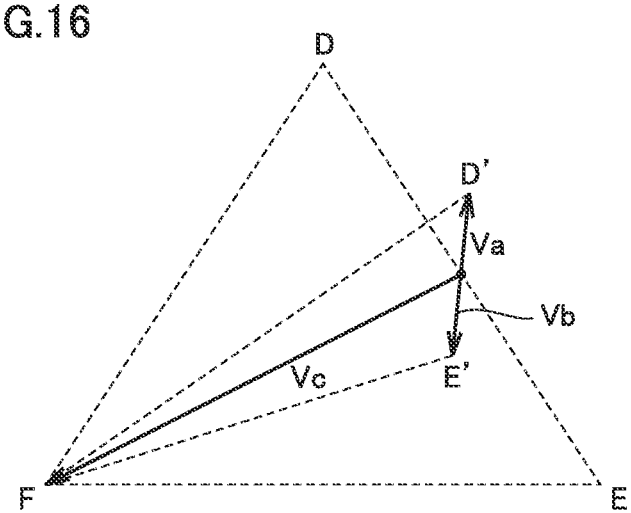
FIG. 16 is a vector diagram of the respective phase voltages in a case where a two-phase ground fault (considering arc resistance) occurs in the a-phase and the b-phase of the power transmission line.

FIG. 13 is a vector diagram of the respective phase voltages in a case where power transmission line L is normal. FIG. 14 is a vector diagram of the respective phase voltages in a case where a one-phase ground fault occurs in the a-phase of power transmission line L. FIG. 15 is a vector diagram of the respective phase voltages in a case where a two-phase ground fault (without considering arc resistance) occurs in the a-phase and the b-phase of power transmission line L. FIG. 16 is a vector diagram of the respective phase voltages in a case where a two-phase ground fault (considering arc resistance) occurs in the a-phase and the b-phase of power transmission line L.

Referring to FIGS. 13 and 14, in the case where power transmission line L is normal or in the case where a one-phase ground fault occurs in power transmission line L, the ends (arrow sides) of respective phase voltages Va, Vb, and Vc (vectors) serve as vertices of a regular triangle DEF. Accordingly, in the case where power transmission line L is normal or in the case of a one-phase ground fault, line voltages Vab, Vbc, and Vca maintain the rated line voltage.

In addition, referring to FIGS. 15 and 16, in the case where a two-phase ground fault occurs in power transmission line L, a neutral point exists on a straight line DE, irrespective of whether or not arc resistance is considered. Accordingly, in the case where a two-phase ground fault occurs in power transmission line L, at least two (in this case, line voltages Vbc and Vca) of line voltages Vab, Vbc, and Vca between respective two phases maintain relatively high voltages.

Thus, operation processing unit 30 is provided with first determination unit 100 which determines whether or not at least two of the line voltages between the respective two phases are less than or equal to a threshold value K1, and second determination unit 200 which determines whether or not the ratio between a minimum value of the line voltages between the respective two phases and a minimum value of the respective phase voltages is less than or equal to a threshold value β. This can prevent an incorrect ground fault output due to an abnormality in voltage transformer 4, and also prevent incorrect non-operation due to detection of an abnormality in voltage transformer 4, while maintaining the sensitivity (for example, 30 to 40%) required to protect the power system.

Referring to FIG. 11 again, configurations of first determination unit 100 and second determination unit 200 will be specifically described. First determination unit 100 includes determination circuits 101, 102, and 103, and logic gates 104, 105, 106, and 107.

Determination circuits 101, 102, and 103 determine whether or not line voltages Vab, Vbc, and Vca are less than or equal to threshold value K1, respectively. Each determination circuit outputs "1" when it determines that the corresponding line voltage is less than or equal to threshold value K1, and outputs "0" when it determines that the corresponding line voltage is more than threshold value K1. As threshold value K1, the greater value of a constant A and a value obtained by multiplying a maximum value (absolute value) of line voltages Vab, Vbc, and Vca by a coefficient $\alpha$ ($\alpha<1$) is adopted.

Logic gate 104 performs an AND operation on respective output values of determination circuits 101 and 102, logic gate 105 performs an AND operation on respective output values of determination circuits 102 and 103, and logic gate 106 performs an AND operation on respective output values of determination circuits 103 and 101. Output values of logic gates 104 to 106 are input into logic gate 107. Logic gate 107 performs an OR operation on the respective output values of logic gates 104 to 106. An output value of logic gate 107 is input into logic gate 402.

With such a configuration, when a condition X1 that at least two of line voltages Vab, Vbc, and Vca between the respective two phases are less than or equal to threshold value K1 is satisfied, an output value "1" is output from logic gate 107, and when condition X1 is not satisfied, an output value "0" is output from logic gate 107.

As a specific example, when the a-phase is disconnected in voltage transformer 4, it is generally considered that a-phase voltage Va is within the range of region 700 in FIG. 12, as described above. Line voltages Vab and Vca in this case are smaller than line voltage Vbc. In contrast, in the case where power transmission line L is normal, in the case of a one-phase ground fault, and in the case of a two-phase ground fault, at least two line voltages Vbc and Vca are maintained at a value close to line voltage Vbc. Accordingly, the value obtained by multiplying line voltage Vab, Vbc, or Vca by coefficient $\alpha$ corresponds to the minimum value of the line voltages measured when voltage transformer 4 is normal, and when at least two line voltages are smaller than this value, it can be determined that voltage transformer 4 is abnormal.

Coefficient $\alpha$ is set such that no incorrect operation occurs in the case of a one-phase ground fault, an incorrect lock region is reduced in the case of a two-phase ground fault, and a detection region for an abnormality in voltage transformer 4 is provided as widely as possible. For example, a is set to 0.75. It should be noted that constant A is a fixed value for detecting disconnections of two lines in voltage transformer 4.

First determination unit 100 as described above may have any configuration capable of determining whether or not condition X1 is satisfied, and may be implemented by a configuration (determination circuit(s), logic gate(s)) other than that described above.

Next, second determination unit 200 includes determination circuits 201 and 202. Determination circuit 201 determines whether or not the ratio between the minimum line voltage and the minimum phase voltage (i.e., the ratio of the minimum line voltage to the minimum phase voltage) is less than or equal to threshold value $\beta$ (>1). That is, determination circuit 201 determines whether or not equation (1) described above is satisfied. Thereby, when a condition X2 that the ratio between the minimum value of line voltages Vab, Vbc, and Vca between the respective two phases and the minimum value of respective phase voltages Va, Vb, and Vc is less than or equal to threshold value $\beta$ is satisfied, an output value "1" is output from determination circuit 201 to a logic gate 401 described later, and when condition X2 is not satisfied, an output value "0" is output to logic gate 401.

Determination circuit 202 determines whether or not the minimum phase voltage is more than or equal to a constant K2. That is, determination circuit 202 determines whether or not equation (2) described above is satisfied. When determination circuit 202 determines that the minimum phase voltage is more than or equal to constant K2, determination circuit 202 outputs "1" to logic gate 401, and otherwise outputs "0".

As a specific example, when the a-phase is disconnected in voltage transformer 4, it is generally considered that a-phase voltage Va is within the range of region 700 in FIG. 12. The ratio of the minimum value of line voltages Vab, Vbc, and Vca to a-phase voltage Va, b-phase voltage Vb, or c-phase voltage Vc can take a value close to 1. However, referring to FIGS. 13 to 16, it is clear that the ratio between the minimum value of respective phase voltages Va, Vb, and Vc and the minimum value of line voltages Vab, Vbc, and Vca is more than or equal to $3^{1/2}$, both in the cases where power transmission line L is normal and abnormal. Therefore, when this ratio is less than or equal to threshold value $\beta$ (for example, 1.3), it can be determined that voltage transformer 4 is abnormal.

It should be noted that, as with coefficient $\alpha$, coefficient $\beta$ is set such that no incorrect operation occurs in the case of a one-phase ground fault, an incorrect lock region is reduced in the case of a two-phase ground fault, and a detection region for an abnormality in voltage transformer 4 is provided as widely as possible. Thus, coefficient $\beta$ is set to 1.3, for example.

In addition, determination circuit 202 prevents incorrect determination by determination circuit 201, by determining whether or not the minimum value of respective phase voltages Va, Vb, and Vc is more than or equal to constant K2. Constant K2 is set to 20 V, for example.

Referring to FIG. 11 again, third determination unit 300 will be described. Third determination unit 300 determines whether or not a condition X3 that the zero-phase voltage is greater than a third threshold value is satisfied. Third determination unit 300 is provided to prevent the possibility that second determination unit 200 may incorrectly determine that voltage transformer 4 has an abnormality, despite a one-phase ground fault accident, and lead to incorrect non-operation (i.e., lock the ground fault output).

Specifically, for example when the a-phase is disconnected in voltage transformer 4, it is generally considered that a-phase voltage Va is within the range of region 700 in FIG. 12. Accordingly, a maximum value of a-phase voltage Va is equal to a sound phase voltage (Vb or Vc). Thus, when a one-phase disconnection occurs in voltage transformer 4, maximum zero-phase voltage V0 is achieved under a condition in which disconnected phase voltage=sound phase voltage. It should be noted that, in this case, a disconnected phase voltage vector overlaps a sound phase voltage vector.

In addition, the relation between zero-phase voltage V0 and the phase voltage in a sound state is expressed as the following equation (3).

$$|3V0| < (\text{phase voltage in sound state}) \times 3^{1/2} \quad (3)$$

Accordingly, above equation (3) is basically satisfied in a case where a one-phase ground fault does not occur in power transmission line L and only a one-phase disconnection occurs in voltage transformer 4. In other words, when the following equation (4) which takes a margin γ (for example, 1.2) into consideration is satisfied, it can be said that a ground fault accident occurs in power transmission line L, rather than an abnormality in voltage transformer 4.

$$|3V0| > K3 = (\text{phase voltage in sound state}) \times 3^{1/2} \times \gamma \quad (4)$$

When the line voltage is 110 V, the phase voltage is 110 V/$3^{1/2}$≈63.5 V, and thus K3 is set to 132 V, for example.

Therefore, third determination unit 300 determines whether or not equation (4) is satisfied (that is, determines whether or not condition X3 is satisfied), and outputs "1" to logic gate 401 when equation (4) is satisfied, and outputs "0" otherwise.

Lock unit 400 locks the detection output by ground fault detection unit 500 when condition X1 to be determined by first determination unit 100 is satisfied, or when condition X2 to be determined by second determination unit 200 is satisfied and condition X3 to be determined by third determination unit 300 is not satisfied.

Specifically, lock unit 400 includes logic gates 401 and 402. Logic gate 401 performs an AND operation on an output value of second determination unit 200 and a value obtained by inverting a logic level of an output of third determination unit 300. Thereby, the output of second determination unit 200 is blocked by the output of third determination unit 300. Thus, even when condition X2 to be determined by second determination unit 200 is satisfied, the output of second determination unit 200 is blocked when condition X3 to be determined by third determination unit 300 is satisfied. This can prevent making incorrect determination that voltage transformer 4 has an abnormality, as described in <Related Technique and Problem Thereof>.

Logic gate 402 performs an OR operation on the output value of logic gate 107 of first determination unit 100 and an output value of logic gate 401. Thereby, when "1" is output from logic gate 107, or when "1" is output from logic gate 401, "1" is output (i.e., a lock command is output) from logic gate 402 to logic gate 502. In this case, a ground fault detection output of ground fault detection unit 500 is locked, as described above.

<Processing Procedure>

Figure 17:
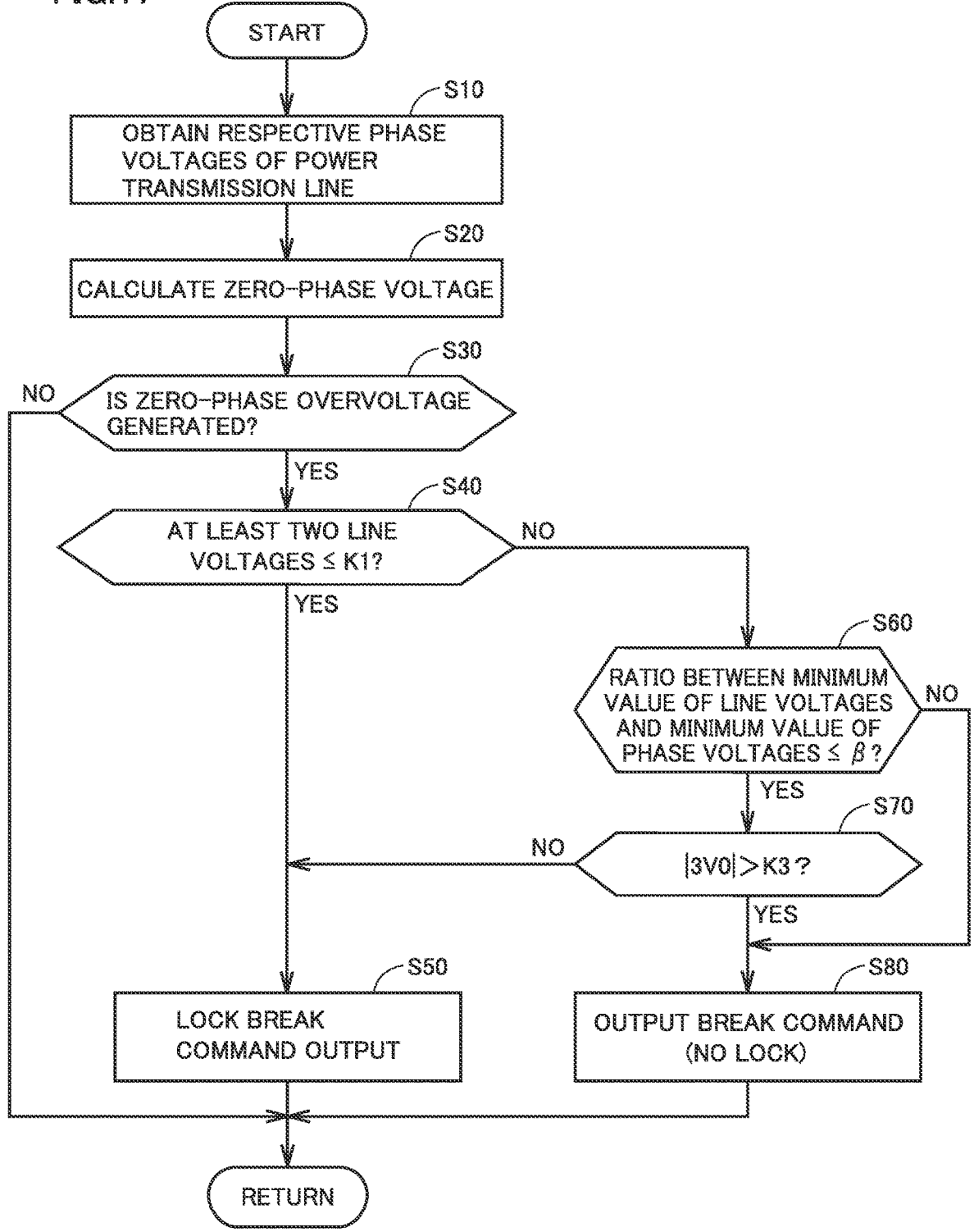
FIG. 17 is a flowchart showing an example of a processing procedure of the operation processing unit according to the first embodiment.

FIG. 17 is a flowchart showing an example of a processing procedure of operation processing unit 30 according to the first embodiment. The following steps are mainly implemented by CPU 32 of operation processing unit 30 executing the program stored in ROM 33. It should be noted that, for facilitating the description, it is assumed here that the determination by determination circuit 202 provided to prevent incorrect determination by determination circuit 201 is satisfied (i.e., equation (2) is satisfied).

Referring to FIG. 17, operation processing unit 30 receives (obtains) inputs of the respective phase voltages of power transmission line L detected by voltage transformer 4 (step S10). Operation processing unit 30 calculates a zero-phase voltage based on the obtained respective phase voltages (i.e., calculates the zero-phase voltage from the sum of the respective phase voltages) (step S20). Operation processing unit 30 determines whether or not the calculated zero-phase voltage is an overvoltage (that is, |3V0|>OVG) (step S30).

When the zero-phase voltage is not an overvoltage (NO in step S30), operation processing unit 30 terminates the processing. That is, operation processing unit 30 determines that no ground fault accident has been detected. When the zero-phase voltage is an overvoltage (YES in step S30), operation processing unit 30 determines whether or not at least two of the line voltages between the respective two phases are less than or equal to threshold value K1 (i.e., whether or not condition X1 is satisfied) (step S40).

When condition X1 is satisfied (YES in step S40), operation processing unit 30 locks the ground fault detection output (step S50). Specifically, operation processing unit 30 disables the output of the ground fault overvoltage relay element to prevent a break command from being output to the breaker. When condition X1 is not satisfied (NO in step S40), operation processing unit 30 determines whether or not the ratio between the minimum value of the line voltages between the respective two phases and the minimum value of the respective phase voltages is less than or equal to threshold value β (i.e., whether or not condition X2 is satisfied) (step S60).

When condition X2 is not satisfied (NO in step S60), operation processing unit 30 enables (i.e., does not lock) the ground fault detection output (step S80). Specifically, operation processing unit 30 outputs a break command to the breaker as the ground fault detection output of the ground fault overvoltage relay element. When condition X2 is satisfied (YES in step S60), operation processing unit 30 determines whether or not zero-phase voltage |3V0| is greater than threshold value K3 (i.e., whether or not condition X3 is satisfied) (step S70).

When condition X3 is satisfied (YES in step S70), operation processing unit 30 enables the ground fault detection output (step S80), and terminates the processing. When condition X3 is not satisfied (NO in step S70), operation processing unit 30 locks the ground fault detection output (step S50), and terminates the processing.

<Advantage>

According to the first embodiment, even in a case where the limiting resistor is not connected to or is disconnected from the voltage transformer for a certain reason, an abnormality in the voltage transformer and a one-phase ground fault accident in the power system are distinguishably detected. Even in such a case, there is no possibility of unnecessarily performing detection of an abnormality in the voltage transformer when a one-phase ground fault accident occurs, and thus the power system can be appropriately protected by outputting a break command and the like.

Second Embodiment

The first embodiment has described the configuration provided with third determination unit 300 which uses the zero-phase voltage to detect an abnormality (disconnection) in voltage transformer 4 and an one-phase ground fault accident with more accuracy. A second embodiment will describe a configuration provided with the third determination unit which uses a phase voltage, instead of third determination unit 300 in the first embodiment. It should be noted that, since <Overall Configuration> and <Hardware Configuration> in the second embodiment are the same as those in the first embodiment, the detailed description thereof will not be repeated.

Figure 18:
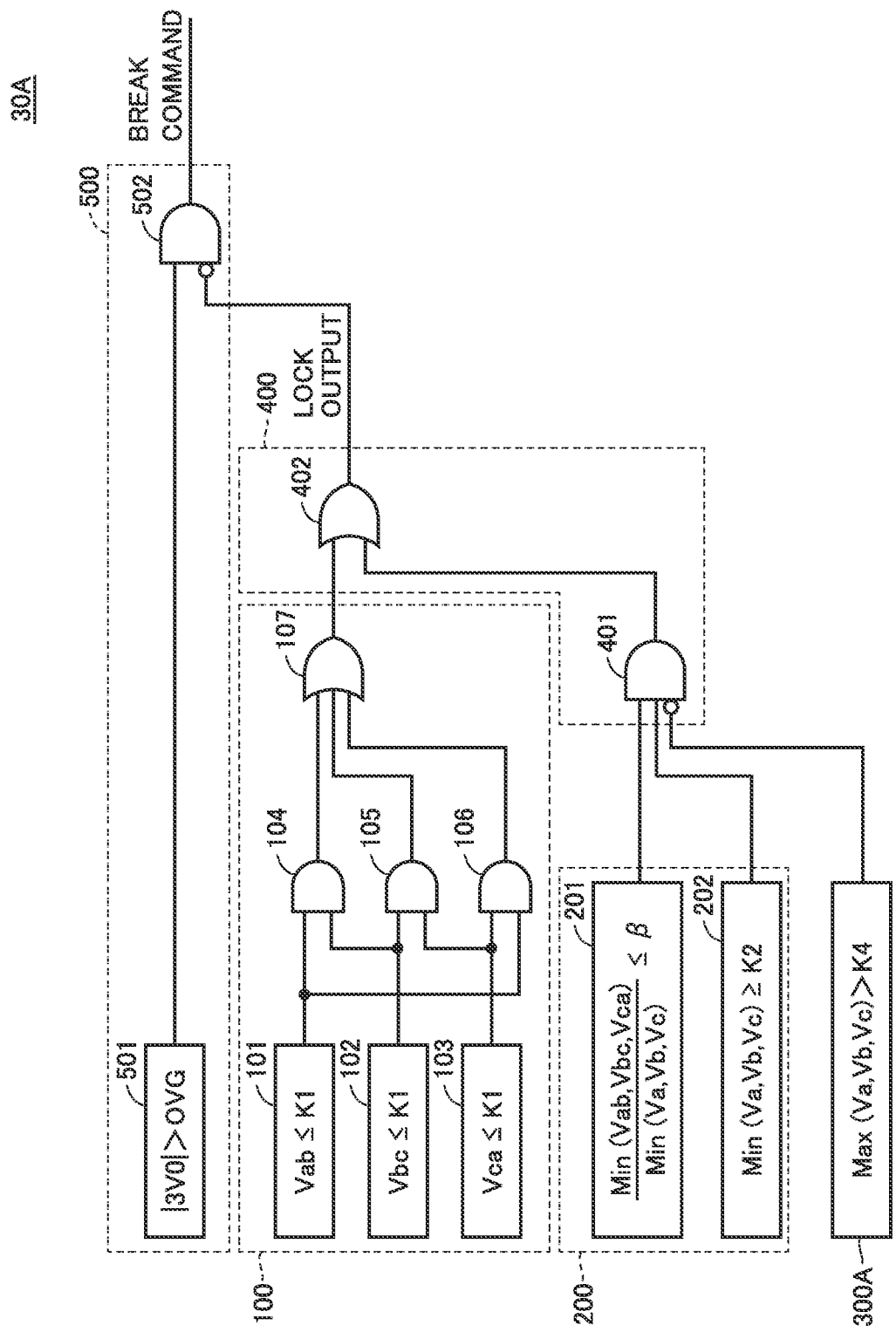
FIG. 18 is a block diagram showing a functional configuration of an operation processing unit according to a second embodiment.

FIG. 18 is a block diagram showing a functional configuration of an operation processing unit 30A according to the second embodiment. Referring to FIG. 18, operation processing unit 30A includes first determination unit 100, second determination unit 200, a third determination unit 300A, lock unit 400, and ground fault detection unit 500. Operation processing unit 30A corresponds to operation processing unit 30 shown in FIG. 10, and is designated with an additional letter "A" for convenience, to distinguish it from operation processing unit 30 in the first embodiment. The same applies to a third embodiment. It should be noted that, since first determination unit 100, second determination unit 200, lock unit 400, and ground fault detection unit 500 in FIG. 18 are the same as those in FIG. 11, the detailed description thereof will not be repeated.

Third determination unit 300A determines whether or not a condition X3a that a maximum value of the respective phase voltages is greater than a threshold value K4 is satisfied. This prevents the possibility that second determination unit 200 may incorrectly determine that voltage transformer 4 has an abnormality, despite a one-phase ground fault accident, and lead to incorrect non-operation.

Specifically, for example when the a-phase is disconnected in voltage transformer 4, it is generally considered that a-phase voltage Va is within the range of region 700 in FIG. 12. Accordingly, the relation of a-phase voltage Va of the disconnected phase<sound phase voltage is satisfied. Further, the sound phase voltage is constant irrespective of a disconnection in voltage transformer 4.

Therefore, when the following equation (5) which takes margin γ (for example, 1.2) into consideration is satisfied, it can be said that a ground fault accident occurs in power transmission line L, rather than an abnormality in voltage transformer 4.

$$\text{Max}\{|Va|,|Vb|,|Vc|\} > K4 = (\text{phase voltage}) \times \gamma \quad (5)$$

When the line voltage is 110 V, the phase voltage is 110 $V/3^{1/2} \approx 63.5$ V, and thus K4 is set to 76.2 V, for example.

<Processing Procedure> in the second embodiment is performed by operation processing unit 30A determining whether or not equation (5) is satisfied in step S70 in FIG. 17. Specifically, when equation (5) is not satisfied, operation processing unit 30A locks the ground fault detection output (step S50 in FIG. 17), and when equation (5) is satisfied, operation processing unit 30 enables the ground fault detection output (step S80 in FIG. 17).

<Advantage>

According to the second embodiment, the second embodiment has the same advantage as that of the first embodiment. Therefore, the configuration of the third determination unit can be selected as appropriate, improving the degree of freedom in design.

Third Embodiment

As described above in <Related Technique and Problem Thereof>, when an inrush current is generated in transformer 2 in the case of a one-phase ground fault accident, the balance among the respective phase voltages is disturbed, and equation (1) is further easily satisfied. As a result, the ground fault overvoltage relay device is more likely to incorrectly determine that voltage transformer 4 has an abnormality, and lead to incorrect non-operation. A third embodiment will describe a configuration that the determination by the third determination unit described above is performed in a period in which the ground fault overvoltage relay device is highly likely to lead to incorrect non-operation as described above. It should be noted that, since <Overall Configuration> and <Hardware Configuration> in the third embodiment are the same as those in the first embodiment, the detailed description thereof will not be repeated.

Figure 19:
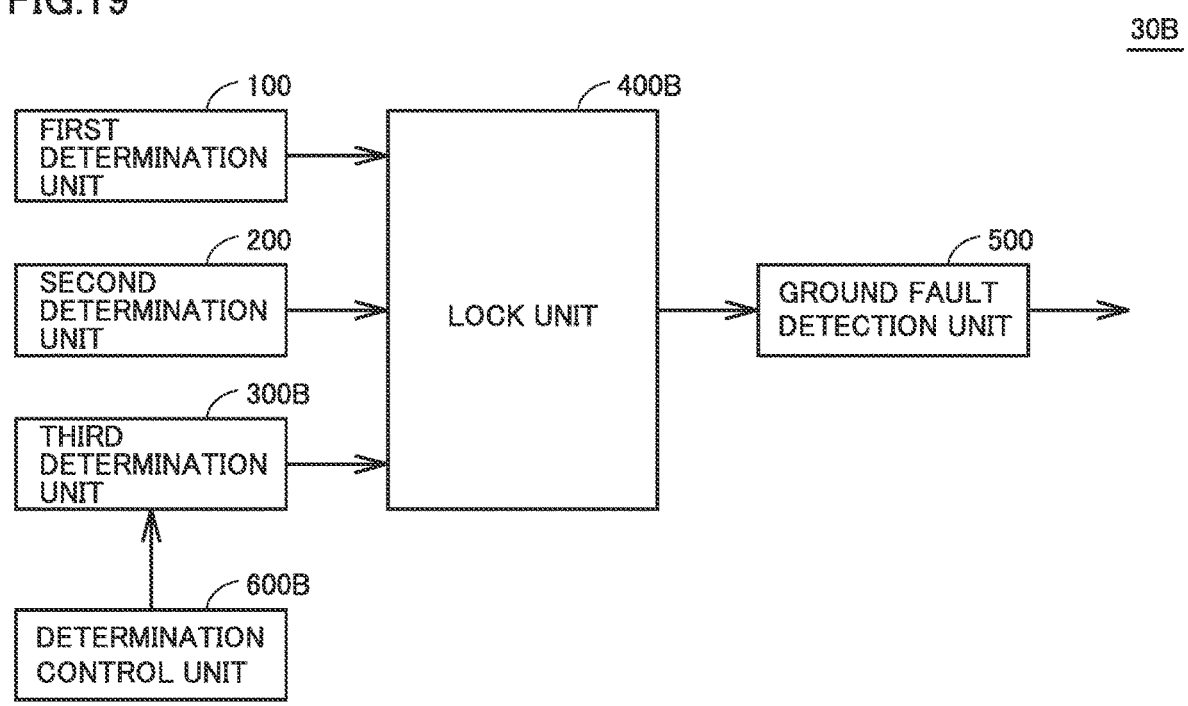
FIG. 19 is a block diagram showing a functional configuration of an operation processing unit according to a third embodiment.

FIG. 19 is a block diagram showing a functional configuration of an operation processing unit 30B according to the third embodiment. Referring to FIG. 19, operation processing unit 30B includes first determination unit 100, second determination unit 200, a third determination unit 300B, a lock unit 400B, ground fault detection unit 500, and a determination control unit 600B. It should be noted that, since first determination unit 100, second determination unit 200, and ground fault detection unit 500 in FIG. 19 are the same as those in FIG. 11, the detailed description thereof will not be repeated.

Here, the inrush current flows into transformer 2 when breaker CB is closed again after a power failure in power transmission line L, and on this occasion, the respective phase voltages of power transmission line L also increase sharply. Therefore, when the respective phase voltages of power transmission line L rise (i.e., increase sharply) after the power failure, it can be regarded that breaker CB is closed again (i.e., the inrush current is generated). Thus, determination control unit 600B controls third determination unit 300B to perform determination for condition X3 (or condition X3a) for a predetermined time from when rising of the respective phase voltages is detected after the power failure in power transmission line L (that is, for a period in which the ground fault overvoltage relay device is likely to incorrectly determine that voltage transformer 4 has an abnormality). It is assumed here that determination control unit 600B controls third determination unit 300B to perform determination for condition X3.

Figure 20:
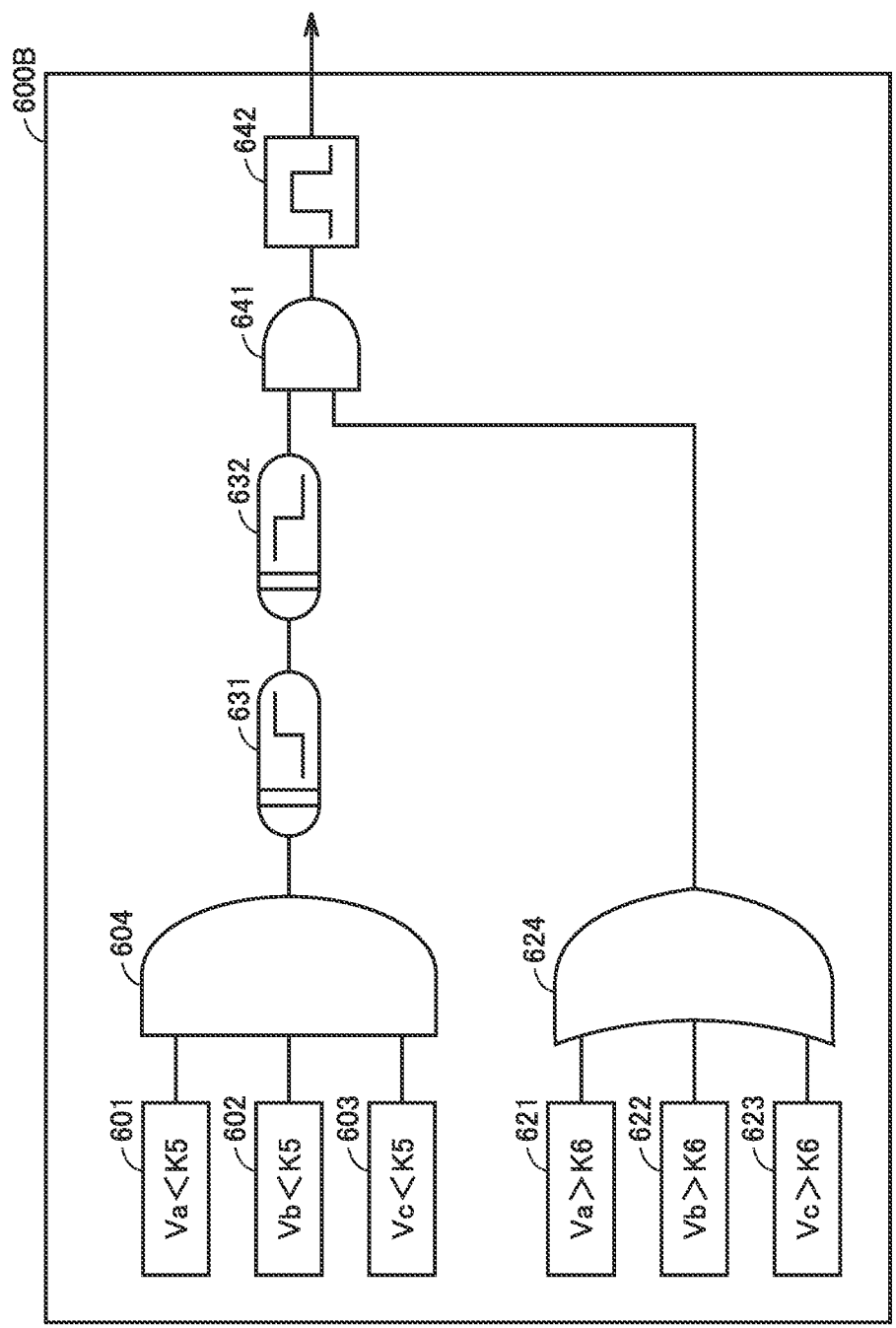
FIG. 20 is a view for illustrating a configuration of a determination control unit according to the third embodiment.

FIG. 20 is a view for illustrating a configuration of the determination control unit according to the third embodiment. Referring to FIG. 20, determination control unit 600B includes determination circuits 601 to 603 and 621 to 623, logic gates 604, 624, and 641, timer circuits 631 and 632, and an output circuit 642.

Determination circuits 601 to 603 determine whether or not phase voltages Va, Vb, and Vc are less than a threshold value K5, respectively. Each determination circuit outputs "1" when it determines that the corresponding phase voltage is less than threshold value K5, and outputs "0" otherwise. Logic gate 604 performs an AND operation on respective output values of determination circuits 601 to 603. Threshold value K5 is a value set to detect a power failure in the power system, and is 5 V, for example.

Timer circuit 631 is a circuit which performs an on-delay operation. Timer circuit 631 outputs an output value "1" to timer circuit 632 when an output value "1" from logic gate 604 is maintained for a time T1. Time T1 is set to a time enough to determine that power transmission line L has a power failure, and is 30 seconds, for example.

Timer circuit 632 is a circuit which performs an off-delay operation. Timer circuit 632 outputs an output value "0" to logic gate 641 when an output value "0" from timer circuit 631 is maintained for a time T2. Time T2 is 100 milliseconds, for example.

Determination circuits 621 to 623 determine whether or not phase voltages Va, Vb, and Vc are greater than a threshold value K6, respectively. Each determination circuit outputs "1" when it determines that the corresponding phase voltage is greater than threshold value K6, and outputs "0" otherwise. Logic gate 624 performs an OR operation on respective output values of determination circuits 621 to 623. Threshold value K6 is a value set to detect recovery of the voltage of power transmission line L, and is 50 V, for example.

Logic gate 641 performs an AND operation on an output value of timer circuit 632 and an output value of logic gate 624. When output circuit 642 receives an input of an output value "1" from logic gate 641, output circuit 642 outputs an output value "1" for a time T3. Time T3 is set in consideration of a period for which the inrush current flows when transformer 2 is closed, and is one minute, for example.

With the above configuration, when a state where all phase voltages Va, Vb, and Vc are less than threshold value K5 is maintained for time T1 or more (i.e., when power transmission line L has a power failure for time T1 or more), the output value "1" is output from timer circuit 631. Then, when power transmission line L recovers from the power failure, an output value "1" is output from timer circuit 632 and logic gate 624 for time T2, and thus the output value "1" is output from logic gate 641. Thereby, the output value "1" is output from output circuit 642 for time T3.

As described above, when determination control unit 600B determines that at least one of the respective phase voltages is more than or equal to threshold value K5 after the power failure in power transmission line L, determination control unit 600B sends third determination unit 300B a performance instruction to perform determination for condition X3 (corresponding to the output value "1" output from output circuit 642). Determination control unit 600B sends third determination unit 300B a stop instruction to stop the determination for condition X3 (corresponding to an output value "0" output from output circuit 642) when a predetermined time (corresponding to time T3) has elapsed from the start of the determination.

According to the control by determination control unit 600B, third determination unit 300B starts or stops the determination of whether or not condition X3 is satisfied. Specifically, when third determination unit 300B receives the above performance instruction from determination control unit 600B (i.e., when at least one of the respective phase voltages is more than or equal to threshold value K5 after the power failure in power transmission line L), third determination unit 300B starts the determination of whether or not condition X3 is satisfied. In addition, when third determination unit 300B receives the above stop instruction from determination control unit 600B (i.e., when the predetermined time has elapsed from the start of the determination of whether or not condition X3 is satisfied), third determination unit 300B stops the determination.

In a case where the determination is stopped by third determination unit 300B, lock unit 400B locks the detection output by ground fault detection unit 500 when condition X1 to be determined by first determination unit 100B or condition X2 to be determined by second determination unit 200B is satisfied. It should be noted that, in a case where the determination is performed (not stopped) by third determination unit 300B, lock unit 400B locks the detection output by ground fault detection unit 500 when condition X1 is satisfied, or when condition X2 is satisfied and condition X3 is not satisfied, as with lock unit 400A.

(Variation)

It should be noted that, as a variation, determination control unit 600B may be configured to receive information indicating closing of breaker CB from breaker CB. In this case, ground fault overvoltage relay device 3 and breaker CB are configured to be capable of communicating with each other. For example, determination control unit 600B according to the variation determines closing or opening of breaker CB by receiving a closing signal or an opening signal from breaker CB.

When determination control unit 600B receives the information indicating closing of breaker CB, determination control unit 600B sends third determination unit 300B a performance instruction to perform determination for condition X3. Then, determination control unit 600B sends third determination unit 300B a stop instruction to stop the determination for condition X3 when a predetermined time has elapsed from the start of the determination.

<Advantage>

According to the third embodiment, the determination for condition X3 or condition X3a is performed only for a period in which the ground fault overvoltage relay device is highly likely to lead to incorrect non-operation. Therefore, the processing load of the device can be reduced.

Another Embodiment

The embodiments described above have described that ground fault overvoltage relay device 3 is configured to calculate the zero-phase voltage based on the respective phase voltages acquired from voltage transformer 4. The configuration of ground fault overvoltage relay device 3 is not limited to such a configuration, and, for example, ground fault overvoltage relay device 3 may be configured to detect the zero-phase voltage as shown in FIG. 21.

Figure 21:
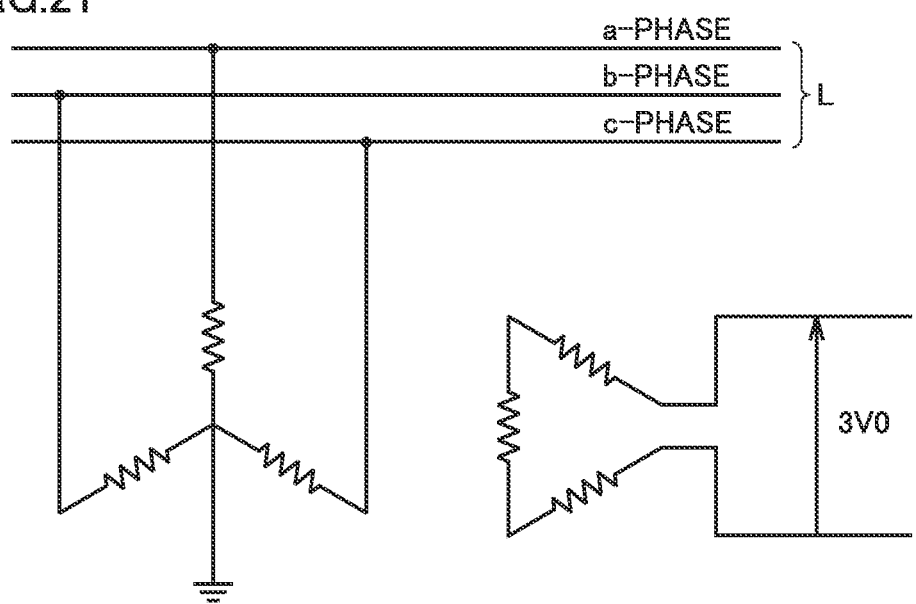
FIG. 21 is a view for illustrating a method for detecting the zero-phase voltage.

FIG. 21 is a view for illustrating a method for detecting the zero-phase voltage. Referring to FIG. 21, ground fault overvoltage relay device 3 may be configured to acquire the zero-phase voltage (3V0) detected by connecting the third winding of voltage transformer 4 to an open delta.

The configurations exemplified as the embodiments described above are examples of the configuration of the present invention, and each configuration can be combined with another well-known technique, or can be modified, for example by omitting a portion thereof, within the scope not departing from the gist of the present invention.

Further, each embodiment described above may be implemented with the processing or the configuration described in another embodiment being adopted therein as appropriate.

It should be understood that the embodiments disclosed herein are illustrative and non-restrictive in every respect. The scope of the present invention is defined by the scope of the claims, rather than the description above, and is intended to include any modifications within the scope and meaning equivalent to the scope of the claims.

REFERENCE SIGNS LIST

2: transformer; 3: ground fault overvoltage relay device; 4: voltage transformer; 6: load; 7: system power supply; 10: auxiliary transformer; 20: AD conversion unit; 21: filter; 24: SH circuit; 26: multiplexer; 27: AD converter; 30, 30A, 30B: operation processing unit; 31: bus; 32: CPU; 33: ROM; 34: RAM; 36: DO circuit; 37: DI circuit; 100, 100B: first determination unit; 101 to 103, 201, 202, 501, 601, 603, 621, 623: determination circuit; 104 to 107, 401, 402, 502, 604, 624, 641: logic gate; 200, 200B: second determination unit; 300, 300A, 300B: third determination unit; 400, 400A, 400B: lock unit; 500: ground fault detection unit; 600B: determination control unit; 631, 632: timer circuit; 642: output circuit; CB: breaker.

The invention claimed is:

1. A ground fault overvoltage relay device, comprising:
an input unit configured to receive inputs of respective phase voltages of a power system detected by a voltage transformer;
a ground fault detection unit configured to detect a ground fault based on a zero-phase voltage calculated from the respective phase voltages;
a first determination unit configured to determine whether or not a first condition is satisfied, the first condition being that at least two of line voltages between respective two phases calculated based on the respective phase voltages are less than or equal to a first threshold value;
a second determination unit configured to determine whether or not a second condition is satisfied, the second condition being that a ratio between a minimum value of the line voltages between the respective two phases and a minimum value of the respective phase voltages is less than or equal to a second threshold value;
a third determination unit configured to determine whether or not a third condition is satisfied, the third condition being that the zero-phase voltage is greater than a third threshold value; and
a lock unit configured to lock a detection output by the ground fault detection unit, wherein the lock unit locks the detection output when the first condition is satisfied, and the lock unit locks the detection output when the second condition is satisfied and the third condition is not satisfied.

2. A ground fault overvoltage relay device, comprising:
an input unit configured to receive inputs of respective phase voltages of a power system detected by a voltage transformer;
a ground fault detection unit configured to detect a ground fault based on a zero-phase voltage calculated from the respective phase voltages;
a first determination unit configured to determine whether or not a first condition is satisfied, the first condition being that at least two of line voltages between respective two phases calculated based on the respective phase voltages are less than or equal to a first threshold value;
a second determination unit configured to determine whether or not a second condition is satisfied, the second condition being that a ratio between a minimum value of the line voltages between the respective two phases and a minimum value of the respective phase voltages is less than or equal to a second threshold value;
a third determination unit configured to determine whether or not a third condition is satisfied, the third condition being that a maximum value of the respective phase voltages is greater than a third threshold value; and
a lock unit configured to lock a detection output by the ground fault detection unit, wherein the lock unit locks the detection output when the first condition is satisfied, and the lock unit locks the detection output when the second condition is satisfied and the third condition is not satisfied.

3. The ground fault overvoltage relay device according to claim 1, wherein the third determination unit starts determination of whether or not the third condition is satisfied when at least one of the respective phase voltages becomes more than or equal to a reference voltage value after a power failure in the power system.

4. The ground fault overvoltage relay device according to claim 1, further comprising a receiving unit configured to receive information indicating closing of a transformer provided to the power system, wherein
the third determination unit starts determination of whether or not the third condition is satisfied when the information is received by the receiving unit.

5. The ground fault overvoltage relay device according to claim 3, wherein
the third determination unit stops the determination of whether or not the third condition is satisfied when a predetermined time has elapsed from start of the determination, and
in a case where the determination is stopped by the third determination unit, the lock unit locks the detection output by the ground fault detection unit when the first condition or the second condition is satisfied.

6. A ground fault overvoltage relay device, comprising:
an input unit configured to receive inputs of respective phase voltages and a zero-phase voltage of a power system detected by a voltage transformer;
a ground fault detection unit configured to detect a ground fault based on the zero-phase voltage;
a first determination unit configured to determine whether or not a first condition is satisfied, the first condition being that at least two of line voltages between respective two phases calculated based on the respective phase voltages are less than or equal to a first threshold value;
a second determination unit configured to determine whether or not a second condition is satisfied, the second condition being that a ratio between a minimum value of the line voltages between the respective two phases and a minimum value of the respective phase voltages is less than or equal to a second threshold value;
a third determination unit configured to determine whether or not a third condition is satisfied, the third condition being that the zero-phase voltage is greater than a third threshold value; and
a lock unit configured to lock a detection output by the ground fault detection unit, wherein the lock unit locks the detection output when the first condition is satisfied, and the lock unit locks the detection output when the second condition is satisfied and the third condition is not satisfied.

7. A ground fault overvoltage relay device, comprising:
an input unit configured to receive inputs of respective phase voltages and a zero-phase voltage of a power system detected by a voltage transformer;
a ground fault detection unit configured to detect a ground fault based on the zero-phase voltage;
a first determination unit configured to determine whether or not a first condition is satisfied, the first condition being that at least two of line voltages between respective two phases calculated based on the respective phase voltages are less than or equal to a first threshold value;
a second determination unit configured to determine whether or not a second condition is satisfied, the second condition being that a ratio between a minimum value of the line voltages between the respective two phases and a minimum value of the respective phase voltages is less than or equal to a second threshold value;

a third determination unit configured to determine whether or not a third condition is satisfied, the third condition being that a maximum value of the respective phase voltages is greater than a third threshold value; and a lock unit configured to lock a detection output by the ground fault detection unit, wherein the lock unit locks the detection output when the first condition is satisfied, and the lock unit locks the detection output when the second condition is satisfied and the third condition is not satisfied.

* * * * *